US012630417B2

(12) United States Patent　　(10) Patent No.: US 12,630,417 B2
Rieder et al.　　(45) Date of Patent: May 19, 2026

(54) PRESSURE TRANSDUCER PACKAGE HAVING A RIGID TRANSFER BLOCK FOR ASSEMBLY TOLERANCE

(71) Applicant: Infineon Technologies AG, Neubiberg (DE)

(72) Inventors: Bernhard Rieder, Regensburg (DE); Bernd Goller, Otterfing (DE)

(73) Assignee: Infineon Technologies AG, Neubiberg (DE)

( * ) Notice: Subject to any disclaimer, the term of this patent is extended or adjusted under 35 U.S.C. 154(b) by 47 days.

(21) Appl. No.: 18/644,368

(22) Filed: Apr. 24, 2024

(65) Prior Publication Data

US 2025/0346483 A1　　Nov. 13, 2025

(30) Foreign Application Priority Data

Jun. 20, 2023　　(EP) ..................................... 23180426

(51) Int. Cl.
　　*B81B 7/00*　　(2006.01)
　　*B81C 1/00*　　(2006.01)
　　*H04R 19/00*　　(2006.01)
(52) U.S. Cl.
　　CPC ........ *B81B 7/0061* (2013.01); *B81C 1/00309* (2013.01); *H04R 19/00* (2013.01); *B81B 2201/0257* (2013.01); *B81B 2203/0127* (2013.01); *B81B 2207/012* (2013.01); *B81B 2207/07* (2013.01); *H04R 2201/003* (2013.01)

(58) Field of Classification Search
　　CPC .... B81C 1/00309; B81B 7/0061; H04R 19/00
　　See application file for complete search history.

(56) References Cited

U.S. PATENT DOCUMENTS

| | | | | |
|---|---|---|---|---|
| 7,843,021 B2 * | 11/2010 | Zhe | ...................... | H01L 25/165 |
| | | | | 257/E23.024 |
| 2007/0058826 A1 * | 3/2007 | Sawamoto | ............. | H04R 19/04 |
| | | | | 381/174 |
| 2008/0175425 A1 * | 7/2008 | Roberts | ................ | H04R 19/005 |
| | | | | 381/361 |
| 2009/0190319 A1 | 7/2009 | Hatakeyama | | |
| 2010/0322443 A1 * | 12/2010 | Wu | ........................... | H04R 1/06 |
| | | | | 381/122 |
| 2014/0161289 A1 * | 6/2014 | Pan | ........................... | H04R 1/04 |
| | | | | 381/174 |
| 2016/0234604 A1 * | 8/2016 | Saxena | ................. | B81B 7/0077 |
| 2017/0318396 A1 * | 11/2017 | Brioschi | ............. | H04R 31/006 |
| 2019/0267318 A1 * | 8/2019 | Pahl | ................... | H01L 23/3121 |

(Continued)

*Primary Examiner* — Olisa Anwah
(74) *Attorney, Agent, or Firm* — Slater Matsil, LLP

(57)　　ABSTRACT

A pressure transducer package comprising a substrate and a lid is attached to the substrate, where a cavity is defined underneath the lid. A MEMS pressure transducer is arranged inside the cavity, the MEMS pressure transducer covering a fluid port. A package pad is provided at a first side of the package, while the fluid port is provided at an opposite second side of the package. A transfer block is configured to provide an electric path between the MEMS pressure transducer and the oppositely arranged package pad, where at least one of the lid and the rigid transfer block comprises an assembly tolerance portion for providing a mechanical assembly tolerance between the rigid transfer block and at least one of the substrate and the lid.

20 Claims, 14 Drawing Sheets

(56)     References Cited

U.S. PATENT DOCUMENTS

| | | | |
|---|---|---|---|
| 2022/0289556 A1* | 9/2022 | Cheng | B81B 7/02 |
| 2023/0012074 A1 | 1/2023 | Li et al. | |
| 2023/0262370 A1* | 8/2023 | Minervini | H04R 1/023 |
| | | | 381/113 |
| 2024/0425363 A1* | 12/2024 | Rieder | B81B 7/02 |

* cited by examiner

PRESSURE TRANSDUCER PACKAGE HAVING A RIGID TRANSFER BLOCK FOR ASSEMBLY TOLERANCE

This application claims the benefit of European Patent Application No. 23180426.1, filed on Jun. 20, 2023, which application is hereby incorporated herein by reference.

TECHNICAL FIELD

Embodiments of the present disclosure relate to MEMS (Micro Electro Mechanical System) devices, and in particular, to a pressure transducer package having a rigid transfer block for assembly tolerance.

BACKGROUND

MEMS pressure transducers, and in particular MEMS sound transducers, are an integral part of nowadays consumer electronics. For example, smartphones, tablets, smart watches, and the like, are usually equipped with one or more sound transducers, such as microphones and speakers. In addition, these consumer devices comprise an ever increasing amount of integrated electronic components in order to satisfy the consumers' needs and desires for increasing features. At the same time, the size and form factor of the devices tends to decrease. Thus, there is a trade off between an increase of electronic components and a decrease of available assembly space.

In some instances, assembly space inside a casing of an electronic device may be highly limited, such that manufacturers of integrated electronic components need to find new solutions for installing their components into small-sized devices. One of the challenging tasks is to properly fit MEMS pressure transducers, including microphones and speakers, into a casing of a consumer electronics device, since these MEMS components may consume additional space for fluid channels for communicating with the environment. For example, microphones and speakers may include sound ports and sound channels for receiving and transmitting sound waves from an external environment surrounding the casing. Thus, these kind of MEMS devices may additionally comprise a predetermined mounting direction.

BRIEF DESCRIPTION OF THE DRAWINGS

In the following, embodiments of the present disclosure are described in more detail with reference to the figures, in which.

DETAILED DESCRIPTION OF ILLUSTRATIVE EMBODIMENTS

Figure 1A:
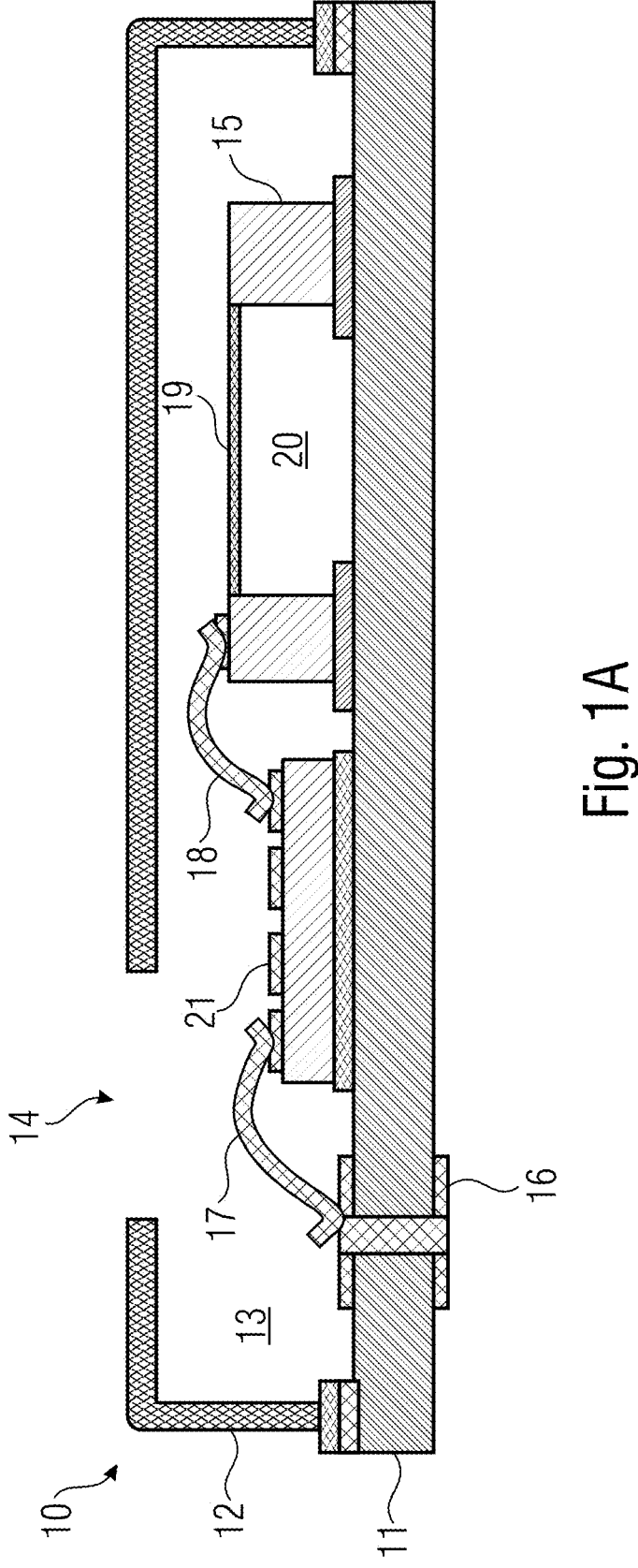
FIG. 1A shows a schematic side view of a MEMS microphone package in a so-called standard top-port configuration.

Equal or equivalent elements or elements with equal or equivalent functionality are denoted in the following description by equal or equivalent reference numerals.

Method steps which are depicted by means of a block diagram and which are described with reference to the block diagram may also be executed in an order different from the depicted and/or described order. Furthermore, method steps concerning a particular feature of a device may be replaceable with the feature of the device, and the other way around.

Embodiments of the present disclosure relate to housed electronic components, and in particular to microstructured MEMS (Micro Electro Mechanical System) pressure transducers, such as environmental pressure sensors. Impinging sound waves may also be detected by pressure transducers, in which case they may be referred to as sound transducers, such as microphones or speakers.

In the following, MEMS sound transducers, and in particular MEMS microphones, may be described as non-limiting examples for MEMS pressure transducers in general. However, each embodiment described herein may comprise a general pressure transducer, such as an environmental pressure sensor or the like.

MEMS devices are usually housed in packages, wherein the packages do also have to comprise fluid openings for allowing a fluid communication of the MEMS with the surrounding environment. For performance reasons, MEMS pressure transducers are to be mounted such that they cover the respective fluid opening of the package.

Thereby, the MEMS pressure transducer may use the entire volume of the package as a back volume.

Due to the above mentioned decreased assembly space, however, some packages may need to be installed such that their fluid opening is positioned opposite to an electronic connection region for electronically connecting the MEMS to an internal circuitry. Accordingly, the package pads and the fluid opening can be positioned on opposite sides of the package. Thus, inside the package a gap remains between the MEMS and the oppositely arranged package pads. In order to electrically connect the MEMS with the package pads, bridging this gap can be involved.

Usually, MEMS devices may be connected to package pads by means of flexible bond wires, i.e. the above mentioned gap can be bridged by a bond wire. The flexibility of the bond wire is preferred since it may account for assembly misalignments, for example if the MEMS device is not positioned at its actual mounting position. The flexible bond wire may be connected to the MEMS by means of soldering.

However, once the package lid is mounted on the package substrate, the package is closed and its inside may not be accessible anymore. Since the MEMS may be enclosed inside the closed package, access to the MEMS and the flexible bond wire in a non-destructive manner can be difficult, i.e. as soon as the package is closed, access to the MEMS and soldering of the flexible bond wire may be prevented. Therefore, stiff and rigid connection means can be used for providing a physical and electrical contact between the MEMS and the package pads when the package is closed. Thus, if the package is closed, the stiff connection means provide a mechanical and electrical contact, comparable to a plug and socket connection.

However, due to the rigid nature of stiff connection means, the MEMS can be placed very precisely (preferably without any assembly tolerances) at its intended mounting position. Even smallest assembly tolerances, which may not be avoidable, may cause a statically overdefined indeterminate mechanical system leading to undesired faults and breakages of the stiff connection means.

Thus, it would be desirable to provide a MEMS pressure transducer package having an electric connection that reliably bridges a physical gap between a MEMS and a package pad enclosed inside a closed package housing, and which, at the same time, allows for assembly tolerances of the MEMS relative to the package pad inside the closed housing.

As described herein, a pressure transducer package can include a rigid transfer block. The pressure transducer package includes a substrate and a lid being attached to the substrate, where a cavity is defined underneath the lid, and a MEMS pressure transducer arranged inside the cavity. The package further includes a fluid port for allowing a fluid communication between an interior and an exterior of the cavity, where the MEMS pressure transducer is mounted such that it covers the fluid port. The package further includes a conductive package pad for electrically contacting the MEMS pressure transducer from outside the package. The package pad is provided at a first side of the package, while the fluid port is provided at an opposite second side of the package. Accordingly, inside the package a physical gap remains between the MEMS pressure transducer at the fluid port and the oppositely arranged package pad. For bridging this gap, the package further includes a rigid transfer block arranged inside the cavity, the transfer block being configured to provide an electric path between the MEMS pressure transducer and the oppositely arranged package pad. According to the herein described innovative principle, at least one of the lid and the rigid transfer block includes an assembly tolerance portion for providing a mechanical assembly tolerance between the rigid transfer block and at least one of the substrate and the lid.

Further examples and embodiments of the pressure transducer package are described in further detail below.

FIG. 1A shows a MEMS microphone package 10 in a standard top-port configuration. The package 10 comprises a substrate 11. A lid 12 is attached to the substrate 11, such that a cavity 13 is formed between the lid 12 and the substrate 11.

In this top-port configuration, the lid 12 comprises an opening 14 through which the cavity 13 is in fluid communication with a package-external environment, i.e. the opening 14 allows for a fluid exchange between an interior and an exterior of the cavity 13. Thus, the opening 14 may also be referred to as a fluid port. In case of a MEMS microphone package, as exemplarily described here, the opening 14 may also be referred to as a sound port.

A MEMS microphone 15 is arranged inside the cavity 13. The MEMS microphone 15 may be attached to the substrate 11. Furthermore, the package 10 includes a conductive package pad 16 for electrically contacting the MEMS microphone 15 from outside the package 10.

Electric conductors 17, 18, such as bond wires, may provide an electric path between the package pad 16 and the MEMS microphone 15. Optionally, a controlling circuitry 21 may sit between the package pad 16 and the MEMS microphone 15 in the electric path.

In this exemplarily shown standard top-port configuration, sound waves may enter the cavity 13 through the sound port 14 provided in the lid 12. The sound waves may impinge on the microphone membrane 19 of the MEMS microphone 15, in response to which the microphone membrane 19 oscillates. These oscillations create a corresponding electric signal that can be conducted through the electric conductors 17, 18, via the controlling circuitry 21, to the package pad 16, from which the signal can be picked up from outside the package 10.

A free space underneath the microphone membrane 19, i.e. between the microphone membrane 19 and the substrate 11, may be referred to as a so-called back volume 20. The larger the back volume 20, the better the sensitivity of the MEMS microphone 15 and its signal-to-noise ratio (SNR) can be. However, as can be seen in FIG. 1A, the size of the back volume 20 may be limited by the size of the free space underneath the microphone membrane 19.

Figure 1B:
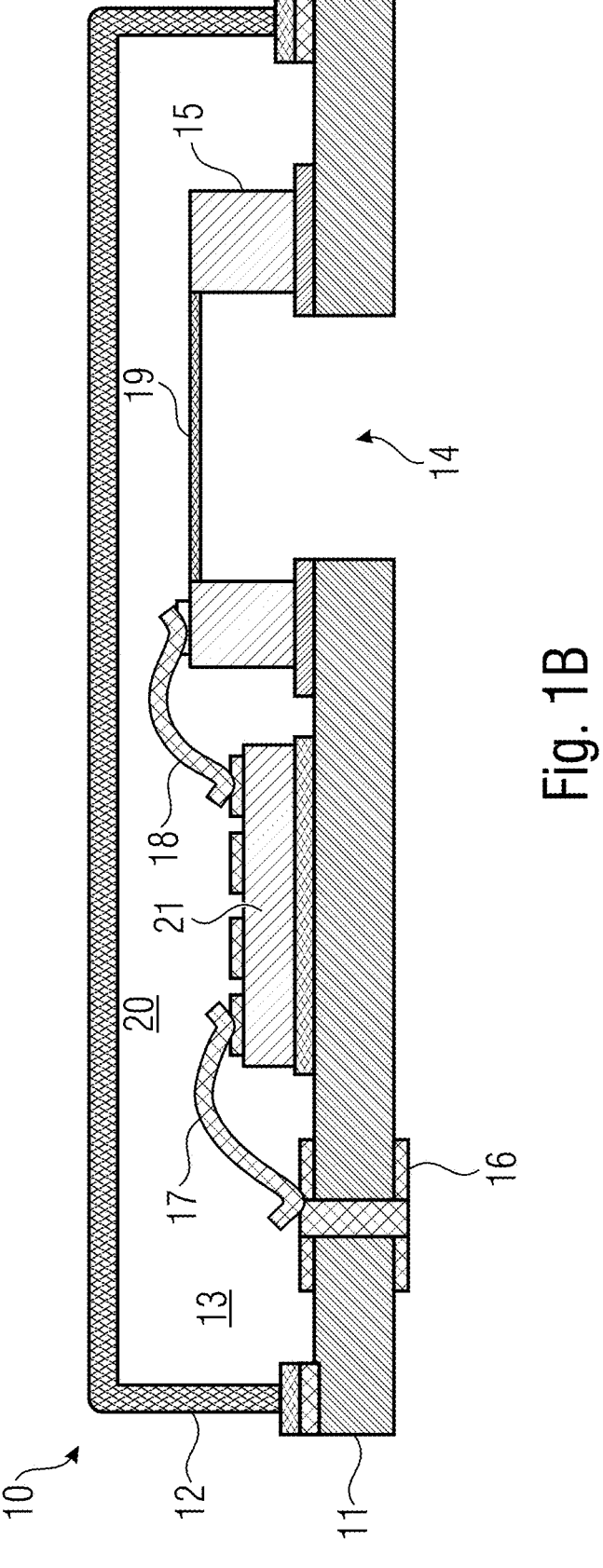
FIG. 1B shows a schematic side view of a MEMS microphone package in a so-called standard bottom-port configuration.

FIG. 1B shows an alternative solution for providing a larger back volume 20. This exemplary configuration may be referred to as a so-called bottom-port configuration. The sound port 14 is provided in the substrate 11. More particularly, the substrate 11 comprises the sound port 14, which enables a fluid exchange between the interior and the exterior of the cavity 13. In this bottom-port configuration, the MEMS microphone 15 covers the sound port 14.

Compared to the top-port configuration of FIG. 1A, the bottom-port configuration of FIG. 1B may provide a larger back volume 20. In particular, the entire cavity 13 can be used as the back volume 20. Accordingly, the MEMS microphone 15 in the bottom-port configuration may exhibit a better sensitivity and lower SNR than in the aforementioned top-port configuration.

As can be seen in FIGS. 1A and 1B, in both the top-port and the bottom-port configuration the MEMS microphone 15 may be mounted on the substrate 11, and the package pad 16 can also be provided in the substrate 11, i.e. the MEMS microphone 15 and the package pad 16 may be arranged on the same side (i.e. the substrate-side) of the package 10.

Accordingly, in the package assembly process the substrate 11 can be completely pre-assembled before the lid 12 is attached, i.e. all components, such as the MEMS microphone 15, the controlling circuitry 21, etc. may be placed and mounted on the substrate 11 before finally mounting the lid 12 onto the substrate 11.

However, in some instances it may be necessary to position the MEMS microphone 15 and the package pad 16 on two opposite sides of the package 10. Such situations may appear if only limited available mounting space dictates a certain mounting position of the package 10 inside an electronic device (e.g. smartphone).

Figure 1C:
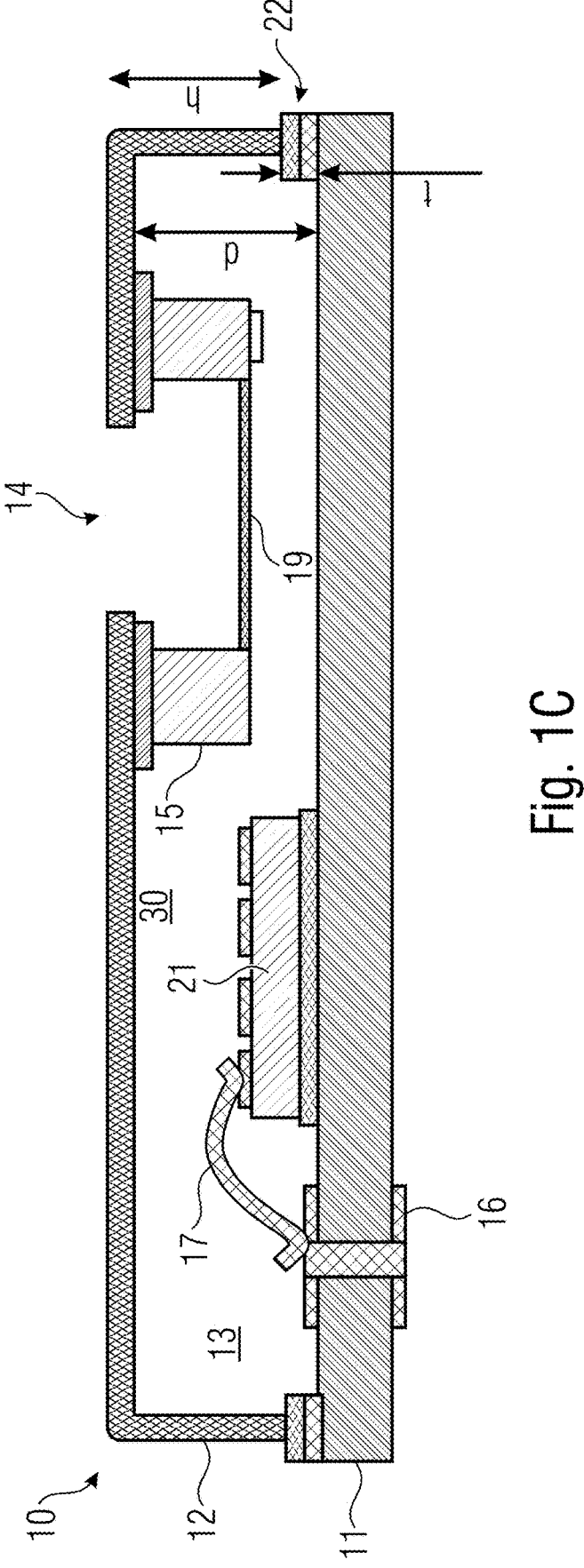
FIG. 1C shows a schematic side view of a MEMS microphone package in a so-called standard flipped top-port configuration.

For example, FIG. 1C shows a flipped top-port configuration, in which the package pad 16 may be provided on the substrate 11, while the MEMS microphone 15 may be attached to the lid 12 for covering the sound port 14 formed therein.

In this situation, the substrate 11 may not be able to be pre-assembled during the package assembly process, i.e. before the lid 12 is attached. As soon as the lid 12 is attached to the substrate 11, the package 10 can be closed such that the interior of the cavity 13 of the package 10 may not be accessible. Accordingly, it may not be possible to provide flexible bond wires for connecting the MEMS microphone 15 (lid-side) with the opposite package pad 16 (substrate-side) since the interior of the cavity 13 of the closed package 10 may not be accessible.

A stiff and rigid connection means can provide a physical and electrical contact between the MEMS microphone 15 and the package pad 16. Thus, if the package is closed, stiff connection means may provide a mechanical and electrical contact comparable to a plug and socket connection.

However, due to the rigid nature of stiff connection means, assembling the MEMS microphone 15 may involve precise placement (with small or no assembly tolerances) at its intended mounting position. Even small assembly tolerances, which may not be avoidable, may cause a statically overdefined indeterminate mechanical system leading to undesired faults and breakages of the stiff connection means. For example, a distance d between the lid 12 and the substrate 11 can be defined by a height h of the lid 12 and a thickness t of the applied mounting means 22 (e.g., adhesives, solder, etc.). If stiff and rigid connection means are applied between the MEMS microphone 15 and the package pad 16, a precise shape and length may be involved in order to fit within the distance. Otherwise, the stiff and rigid connection means may be either be too short (and may fail to provide a proper electric connection), or they may be too large (and may cause an obstruction such that the lid 12 can-not be properly closed). Both cases can describe a statically overdefined indeterminate mechanical system.

Therefore, it is desirable for a MEMS package configuration to have the MEMS microphone 15 and the package pad 16 arranged on two opposite package-sides, which may allow for mounting the lid 12 to the substrate 11 with an assembly tolerance such that the package 10 is provided as a statically underdefined indeterminate mechanical system.

Figure 2:
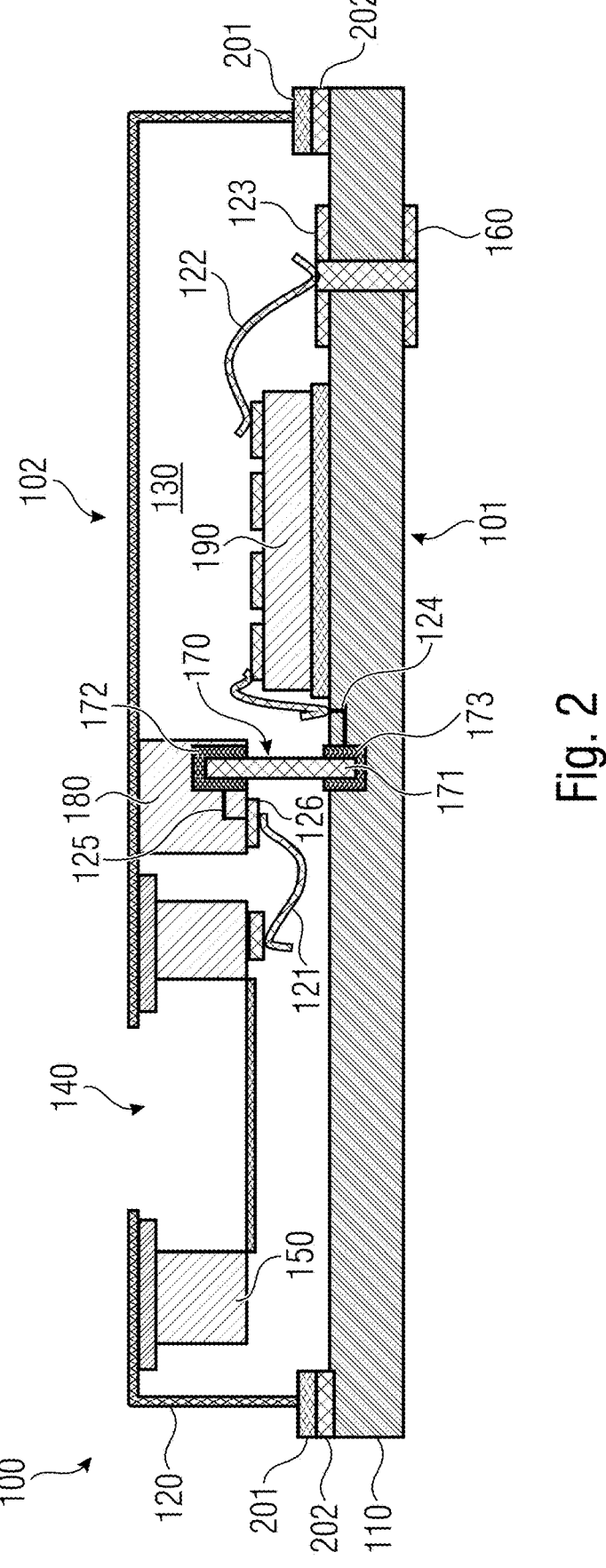
FIG. 2 shows a schematic side view of a pressure transducer package with a rigid transfer block comprising an assembly tolerance portion according to an embodiment.

FIG. 2 shows a first embodiment of a pressure transducer package 100 comprising an opposite-port-pad configuration. The package 100 comprises a substrate 110 and a lid 120 being attached to the substrate 110. A cavity 130 is defined between the substrate 110 and the lid 120, i.e. underneath the lid 120. The lid 120 may be attached to the substrate 110 by means of solder and/or glue 201, 202.

A MEMS pressure transducer 150 is arranged inside the cavity 130. According to this non-limiting example, the MEMS pressure transducer 150 may be configured as a MEMS sound transducer, and in particular as a MEMS microphone. However, the MEMS pressure transducer 150 may also be configured as a MEMS speaker, a MEMS ambient pressure sensor, or any other kind of MEMS pressure transducer.

The package 100 further comprises a fluid port 140 for allowing a fluid exchange between an interior and an exterior of the cavity 130, where the MEMS pressure transducer 150 is mounted such that it covers the fluid port 140. In this non-limiting example, the fluid port 140 is provided in the lid 120. However, the fluid port 140 may be provided in the substrate 110, examples of which are described below. In case the MEMS pressure transducer 150 is configured as a sound transducer, the fluid port 140 may also be referred to as a sound port.

The package 100 further comprises a conductive package pad 160 for electrically contacting the MEMS pressure transducer 150 from outside the package 100. According to the opposite-port-pad configuration, the package pad 160 and the fluid port 140 are positioned on two opposite sides of the package 100, i.e. the package pad 160 may be provided at a first side 101 of the package 100, while the fluid port 140 may be provided at a second side 102 opposite the first side 101 of the package 100. More particular, the fluid port 140 may be provided in (or at) at least one of the lid 120 and the substrate 110, while the package pad 160 may be provided in (or at) the other one of the lid 120 and the substrate 110. According to the non-limiting example shown in FIG. 2, the fluid port 140 is provided in the lid 120, while the package pad 160 is provided in the substrate 110.

Since the MEMS pressure transducer 150 is mounted directly at the fluid port 140, i.e. such that it covers the fluid port 140, the MEMS pressure transducer 150 and the package pad 160 may also be positioned on two opposite sides of the package 100. In some instances, the MEMS pressure transducer 150 may be electrically connected to the oppositely arranged package pad 160.

However, as mentioned above, when the lid 120 is mounted and attached to the substrate 110 during the assembly process, the package 100 is closed, while inside the closed package 100 a physical gap may remain between the MEMS pressure transducer 150 on the first side 101 and the package pad 160 on the second side 102. As mentioned above, this gap can be bridged with an electric conductor for electrically connecting the MEMS pressure transducer 150 with the oppositely positioned package pad 160. However, since the package 100 is closed and may not be accessible and, thus, flexible electric conductors (e.g., bond wires, etc.) may be precluded from installation inside the closed package 100 for connecting the MEMS pressure transducer 150 with the package pad 160.

Therefore, the package 100 can include a rigid transfer block 180 that is arranged inside the cavity 130, the rigid transfer block 180 being configured to provide an electric path between the MEMS pressure transducer 150 and the oppositely arranged package pad 160.

The rigid transfer block 180 can be configured to provide an assembly tolerance between the MEMS pressure transducer 150 and the package pad 160 upon assembly of the package 100, such that the lid 120 (including the MEMS pressure transducer 150) can be mounted and attached to the substrate 110 with a certain assembly tolerance. Therefore, according to an embodiment, the rigid transfer block 180 comprises an assembly tolerance portion 170. The assembly tolerance portion 170 may provide a mechanical assembly tolerance between the rigid transfer block 180 and the substrate 110, and/or between the rigid transfer block 180 and the lid 120.

Additionally or alternatively, the lid 120 may comprise an assembly tolerance portion 170. Also in this case, the assembly tolerance portion 170 may provide a mechanical assembly tolerance between the rigid transfer block 180 and the lid 120, examples and embodiments of which are described below.

Since the assembly tolerance portion 170 provides a mechanical assembly tolerance, the assembly tolerance portion 170 allows for a relative displacement/misalignment between the lid 120 (including any components arranged thereon) and the substrate 110 (including any components arranged thereon) during assembly of the package 100, while still properly establishing an electric path between the MEMS pressure transducer 150 and the oppositely arranged package pad 160. In other words, the electric path between the MEMS pressure transducer 150 and the oppositely arranged package pad 160 may still be properly established even if the lid 120 were attached to the substrate 110 with some misalignment. This is because some predetermined assembly tolerance may be provided by the assembly tolerance portion 170.

When assembling a package in an opposite-port-pad configuration, flexible electric connectors (e.g., bond wires) may be used between the MEMS pressure transducer 150 and the oppositely arranged package pad 160 in order to allow for a relative displacement/misalignment between the lid 120 and the substrate 110. However, flexible connectors may be precluded from installation after the package 100 is closed. A rigid connector (plug-and-socket), instead, can be provided prior to attaching the lid 120 to the substrate 110. However, a rigid connector typically has an exact shape and/or length in order to allow a proper attachment of the lid 120 on the substrate 110. If a rigid connector was too big, it may cause an obstruction such that the lid 120 may not fit anymore and may protrude from the substrate 110. If a rigid connector was too small, instead, the electric path inside the closed package 100 may not be properly established between the MEMS pressure transducer 150 and the package pad 160.

Stated in more technical terms, flexible connectors may provide a statically underdefined indeterminate mechanical system, which can be desirable for opposite-port-pad configurations since it allows for some assembly tolerance or misalignment. However, as noted, flexible connectors may be precluded from subsequent installation. Rigid connectors, instead, may be easy to install but may provide a statically overdefined indeterminate mechanical system.

The herein described methods and devices may combine the advantages of both connecting principles. Even though the transfer block 180 is rigid, the assembly tolerance portion 170 allows for some displacement/misalignment between the lid 120 and the substrate 110. In other words, even though the transfer block 180 is rigid, the additional assembly tolerance portion 170 may provide for a statically underdefined indeterminate mechanical system. This refers to a static mechanical system, in which the lid 120, the rigid transfer block 180 and the substrate 110 are mechanically connected to each other.

The assembly tolerance portion 170 may allow for some misalignment of the rigid transfer block 180 itself. As can be seen in the example shown in FIG. 2, the rigid transfer block 180 may be mounted between the substrate 110 and the lid 120. The rigid transfer block 180 may be fixedly attached to at least one of the substrate 110 and the lid 120. In the example shown in FIG. 2, the transfer block 180 may be fixedly attached (e.g., by means of adhesive) to the inside of the lid 120. In alternative embodiments, described below, the rigid transfer block 180 may be fixedly attached to the substrate 110. In any case, the position at which the transfer block 180 is fixedly mounted/attached is referred to as its predetermined mounting position. The assembly tolerance portion 170 may allow keeping the rigid transfer block 180 at its predetermined mounting position, even if the lid 120 and the substrate 110 are misaligned during assembly.

As exemplarily depicted in FIG. 2, an electric path may be provided inside the package 100 between the MEMS pressure transducer 150 and the oppositely arranged package pad 160. In particular, the transfer block 180 may be configured to provide the electric path between the MEMS pressure transducer 150 and the oppositely arranged package pad 160. Therefore, the transfer block 180 may be electrically connected to the MEMS pressure transducer 150 and the package pad 160, e.g., by means of rigid or flexible connectors, such as wire bonds 121.

A wire bond connection 121 between the MEMS pressure transducer 150 and the rigid transfer block 180 may be provided since both are arranged on the same package-side, e.g. at the lid 120, such that a pre-assembly is possible before finally closing the package 100.

In order to keep the length of the conductive connector 121 as short as possible, the transfer block 180 may be mounted directly adjacent to the MEMS pressure transducer 150, without further components in between. A short length of the conductive connector 121 may enhance the RF stability, since a short conductive connector 121 is less prone to RF interference.

For example, a first conductive path may be provided between the rigid transfer block 180 and the MEMS pressure transducer 150, and a second conductive path may be provided between the rigid transfer block 180 and the package pad 160. The first and second conductive paths may be parts of the electric path between the MEMS pressure transducer 150 and the package pad 160.

Optionally, a controlling circuitry 190 (e.g., an ASIC) for controlling the MEMS pressure transducer 150 may be arranged inside the package 100, wherein the controlling circuitry 190 may sit in the electric path between the MEMS pressure transducer 150 and the package pad 160. The controlling circuitry 190 may be coupled to the electric path by means of electric conductors, such as wire bonds, as exemplarily depicted in FIG. 2, or via flip-chip bonding.

However, the controlling circuitry 190 may also be arranged outside the package 100, where it does not sit in the electric path between the MEMS pressure transducer 150 and the package pad 160. Accordingly, even though it is exemplarily depicted in FIG. 2 that the rigid transfer block 180 may be coupled to an internal controlling circuitry 190, the rigid transfer block 180 may be directly coupled to the package pad 160.

Electric connections on the substrate 110 may be provided by a conductive wiring provided in or at the substrate 110. The wiring may comprise at least one of conducting wire bonds 122, conducting surface pads 123, conducting surface traces (not shown) and conducting layers 124 integrated into the substrate 110. The substrate 110 may be a Printed Circuit Board (PCB).

In the same way, the transfer block 180 may comprise at least one of the above mentioned electric conductors. For example, the transfer block 180 may comprise a material similar to a Printed Circuit Board (PCB), such as resin, where one or more electric conductors may be implemented in one or more layers of the transfer block 180. Additionally or alternatively, the rigid transfer block 180 may comprise at least one of conductive surface pads 126 and conductive surface traces 125.

In the embodiment shown in FIG. 2, the rigid transfer block 180 is attached to the lid 120 and spaced apart from the substrate 110, where a physical gap remains between the rigid transfer block 180 and the substrate 110. In this exemplary embodiment, the assembly tolerance portion 170 may comprise a conductive pin 171 for bridging the gap and for providing a conductive path between the rigid transfer block 180 and the substrate 110.

The assembly tolerance portion 170 may further comprise a recess 172 provided in the rigid transfer block 180, wherein the conductive pin 171 is, at least partly, arranged inside the recess 172. The recess 172 may be wider than a width of the conductive pin 171, such that the conductive pin 171 is accommodated inside the recess 172 by a clearance-fit. Thus, when attaching the lid 120 to the substrate 110, the pin 171 can move inside the recess 172 in a clearance-fit manner, thereby providing an assembly tolerance that allows for a misalignment of the lid 120 relative to the substrate 110.

Additionally or alternatively to the above discussed recess 172 provided in the transfer block 180, a recess 173 may be provided in the substrate 110. The recesses 172, 173 may be positioned opposite to each other. The conductive pin 171 may be, at least partly, arranged inside the recess 173 in the substrate 110. The recess 173 in the substrate 110 may be wider than a width of the conductive pin 171, such that the conductive pin 171 is accommodated inside the recess 173 by a clearance-fit. Thus, when attaching the lid 120 to the substrate 110, the pin 171 can move inside the recess 173 in a clearance-fit manner, thereby providing an assembly tolerance that allows for a misalignment of the lid 120 relative to the substrate 110.

Optionally, a clearance between the conductive pin 171 and the recess 172, and/or a clearance between the conductive pin 171 and the recess 173, may be filled with conductive filler material, for example solder, solder paste, or a conductive adhesive. For example, a conductive adhesive may comprise an anisotropically conductive adhesive material (ACA) or an anisotropically conductive film material (ACF). In this case, the recesses 172, 173 may serve the purpose of a reservoir, e.g. a solder reservoir or a glue reservoir, that may be partly or completely filled with the respective conductive filler material.

The conductive filler material may be elastic, at least prior to or during assembly of the package 100. For example, the conductive filling material may comprise an adhesive that is elastic, at least prior to curing. The filling material may be applied to the recess 172, 173 during a pre-assembly step, i.e. prior to attaching the lid 120 to the substrate 110. The filling material may be liquid, pasty or viscous. After assembly, i.e. after the lid 120 has been attached to the substrate 110, the filler material may cure, where the filler material may remain elastic or may become inelastic at room temperature. For example, an adhesive may be permanently elastic at room temperature even after curing, or it may be temporarily elastic at room temperature such that it becomes stiff and inelastic after curing. For example, the bonding material 250 may comprise a permanently elastic soft glue.

Alternatively, the filler material may be solid at room temperature. Then, the filler material can be heated such that the filer material becomes liquid, pasty or viscous. For example, if the filler material comprises solder, then the package 100 may undergo a thermal reflow process in which the solder is heated such that it gets viscous. In this state, the conductive pin 171 may be inserted into the viscous filler material contained in the recesses 172, 173. After decreasing the temperature below the reflow temperature of the filling material, the filling material may return to its solid state at room temperature.

For example, prior to assembly, the conductive pin 171 may be inserted into the recess 172 provided in the transfer block 180. During this pre-assembly stage, the conductive pin 171 may be fixedly secured inside the recess 172, e.g. by means of the conductive filler material (e.g. solder or glue). When attaching the lid 120 to the substrate 110, the conductive pin 171 may be inserted into the opposite recess 173 provided in the substrate 110. After the lid 120 has been attached to the substrate 110, the conductive pin 171 may be fixedly secured inside the opposite recess 173, e.g. by means of the conductive filler material.

In an alternative embodiment, which is not explicitly depicted, the conductive pin 171 may be omitted. In this case, the assembly tolerance portion 170 may comprise the recesses 172, 173 being filled with the conductive filler material. During assembly, when the lid 120 is attached to the substrate 110, the filler material contained in one of the recesses 172, 173 may combine with the filler material contained in the other one of the two recesses 172, 173. For example, if the filler material comprises solder, then the package 100 may undergo a thermal reflow process in which the solder is heated such that it gets viscous. Accordingly, the solder contained in the two recesses 172, 173 may reflow and combine with each other.

Figure 3:
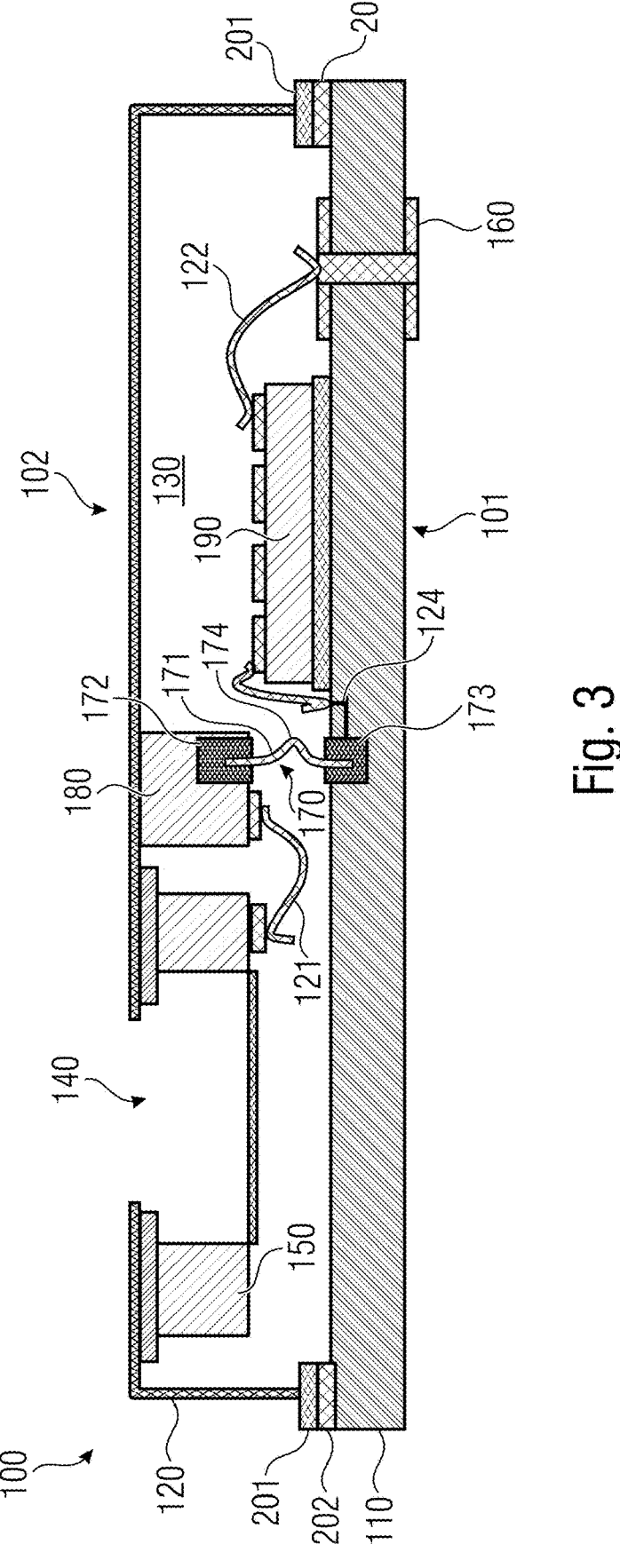
FIG. 3 shows a schematic side view of a pressure transducer package with a rigid transfer block comprising an assembly tolerance portion according to a further embodiment.

In FIG. 2, the conductive pin 171 may be formed as a straight and rigid pin, i.e. the conductive pin 171 may not be flexible. FIG. 3 shows an alternative configuration of the conductive pin 171, wherein like elements with like or similar functionality as in FIG. 2 are denoted with like reference numerals.

FIG. 3 shows a further embodiment of the package 100, where like elements with like or similar functionality as in FIG. 2 are denoted with like reference numerals. According to this embodiment, the MEMS pressure transducer 150 covering the fluid port 140 may be arranged at or on the lid 120, while the package pad 160 may be arranged at or on the substrate 110. Thus, the MEMS pressure transducer 150 and the package pad 160 are arranged on two opposite sides of the package 100.

FIG. 3 shows a conductive pin 171 comprising a bent portion 174 for providing a higher flexibility to the conductive pin 171 as compared to a straight pin. For example, the conductive pin 171 may be provided as a bent metal piece to accommodate process tolerances. The bent portion 174 may enhance the flexibility of the pin 171 in a vertical direction, i.e. a direction between the lid 120 and the substrate 110. This flexibility allows a further degree of freedom in providing an assembly tolerance by means of the assembly tolerance portion 170.

It may be sufficient if the assembly tolerance portion 170 includes one single transfer block 180 and/or one single pin 171 as discussed above with reference to FIGS. 2 and 3. Alternatively, two or more pins 171 may be provided with or without the above discussed bent portion 174. The two or more pins 171 may be arranged in a respective number of further recesses provided in the transfer block 180. Alternatively, the two or more pins 171 may be arranged inside a respective number of recesses provided in two or more transfer blocks 180. In turn, the two or more pins 171 may be arranged in a respective number of further recesses provided in the substrate 110.

Figure 4:
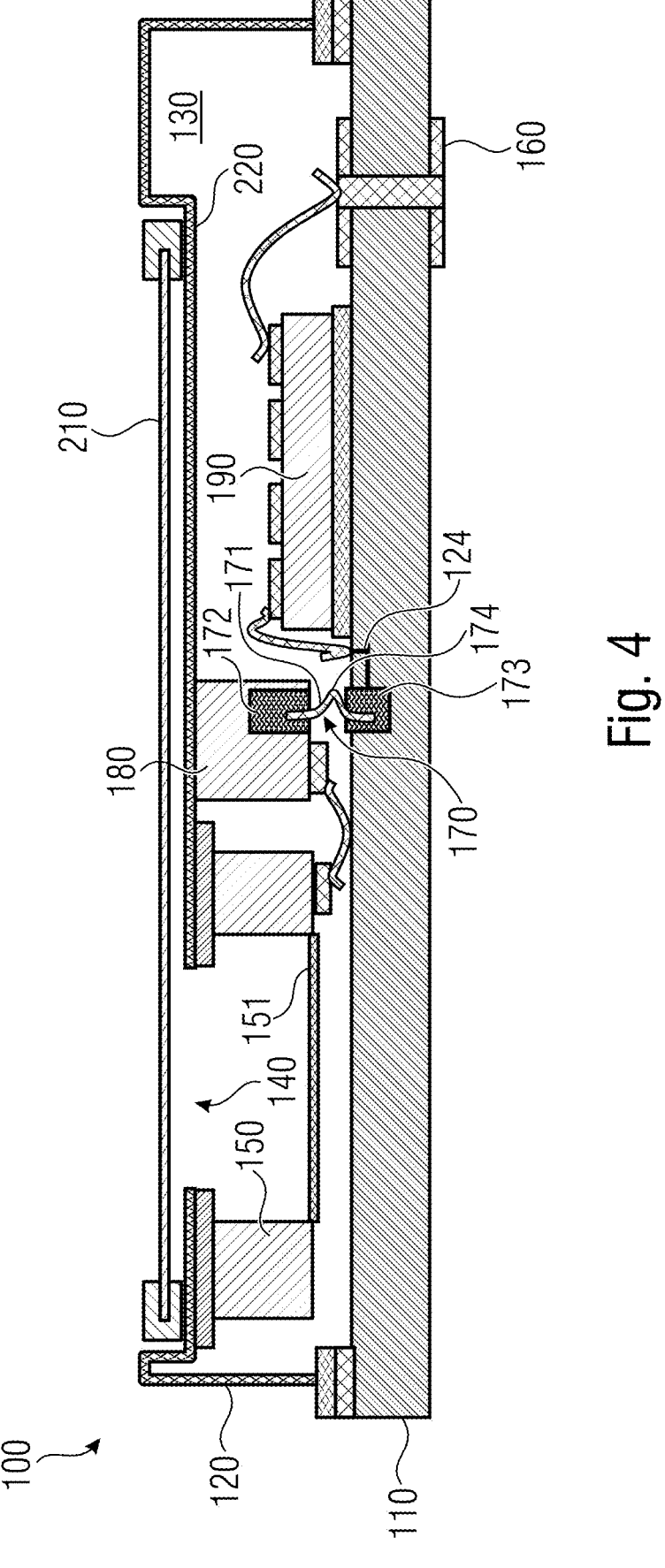
FIG. 4 shows a schematic side view of a pressure transducer package with a rigid transfer block comprising an assembly tolerance portion according to a further embodiment.

FIG. 4 shows a further embodiment of the package 100, where like elements with like or similar functionality as in FIGS. 2 and 3 are denoted with like reference numerals. According to this embodiment, the MEMS pressure transducer 150 covering the fluid port 140 may be arranged at or on the lid 120, while the package pad 160 may be arranged at or on the substrate 110. Thus, the MEMS pressure transducer 150 and the package pad 160 may be arranged on two opposite sides of the package 100.

In this embodiment, the conductive pin 171 may comprise a bent portion 174. Alternatively, the conductive pin 171 may be formed as a straight and rigid pin, as shown in FIG. 2.

A difference compared to the previous Figures is the additional environmental barrier structure 210 that may cover the fluid port 140 from the outside of the lid 120. The environmental barrier structure 210 may act as a mechanical barrier against ingress of dust, fluids, solid matter, and the like, which may otherwise cause mechanical damage of the MEMS membrane 151. The environmental barrier structure 210 may be provided as a stiff rigid mesh or as a compliant/flexible membrane.

The environmental barrier structure 210 may be integrated into the lid 120. Therefore, the lid 120 may comprise a recess or indentation 220 at its outer surface in which the environmental barrier structure 210 may be accommodated.

Figure 5:
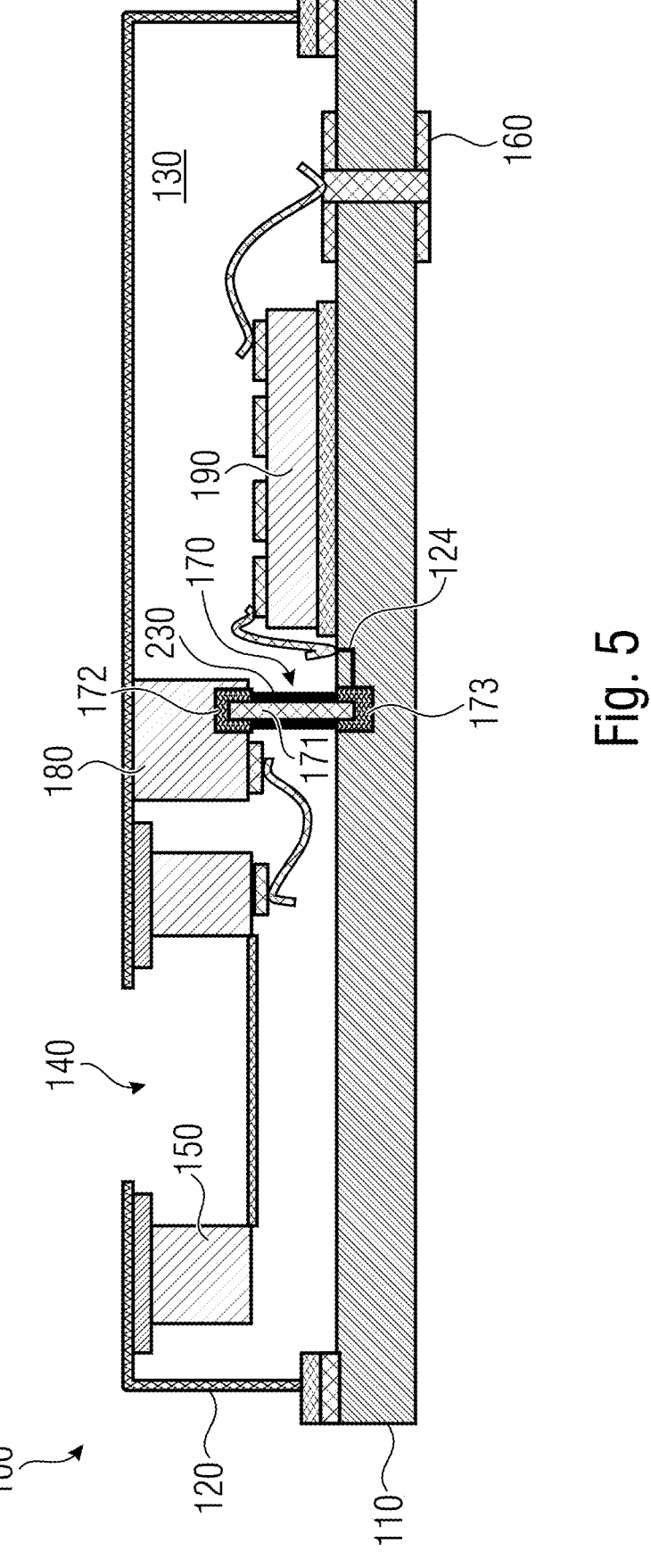
FIG. 5 shows a schematic side view of a pressure transducer package with a rigid transfer block comprising an assembly tolerance portion according to a further embodiment.

FIG. 5 shows a further embodiment of the package 100, where like elements with like or similar functionality as in the previous Figures are denoted with like reference numerals. According to this embodiment, the MEMS pressure transducer 150 covering the fluid port 140 may be arranged at or on the lid 120, while the package pad 160 may be arranged at or on the substrate 110. Thus, the MEMS pressure transducer 150 and the package pad 160 may be arranged on two opposite sides of the package 100.

In this embodiment, the conductive pin 171 may either comprise a bent portion 174, as depicted in FIG. 3, or the conductive pin 171 may be formed as a straight and rigid pin, as depicted in FIG. 2.

A difference compared to the previously discussed embodiments is the additional insulation structure 230 provided at the outer circumference of the conductive pin 171. The insulation structure 230 may protect the conductive pin 171 from shorting.

Figure 6:
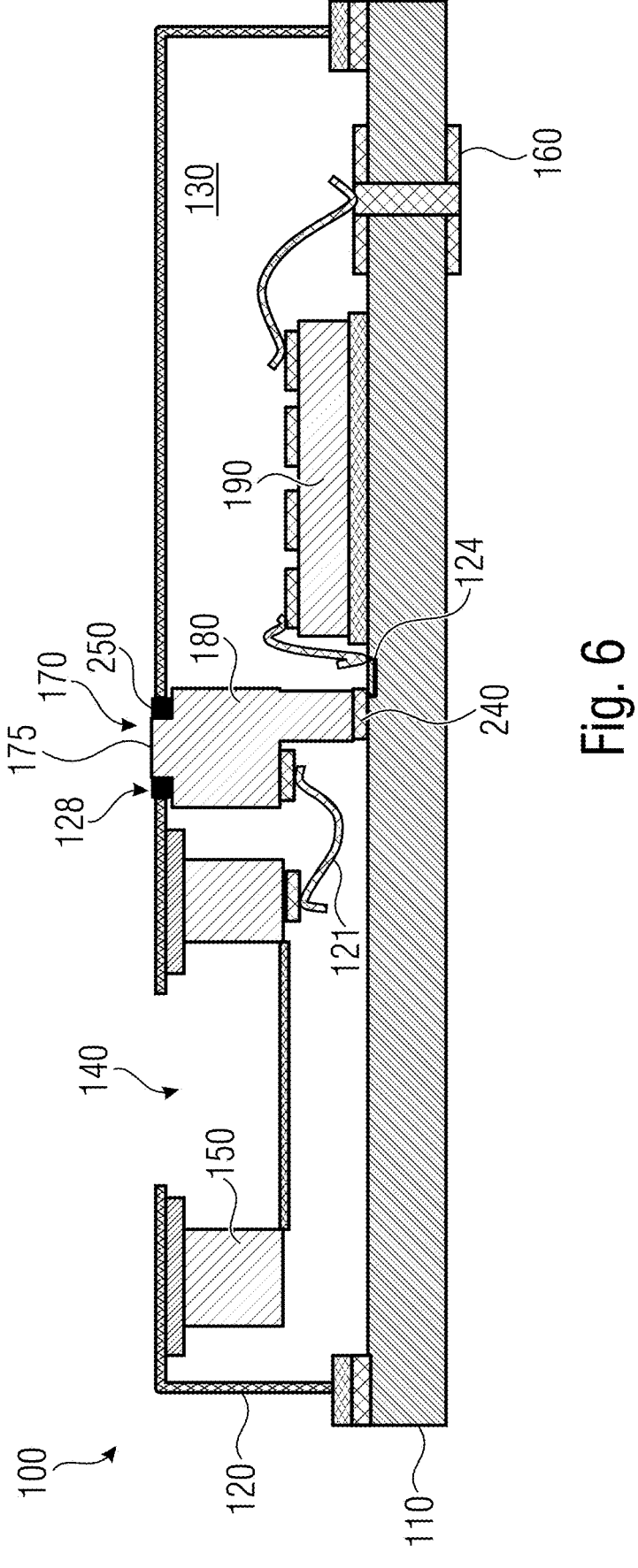
FIG. 6 shows a schematic side view of a pressure transducer package with a rigid transfer block comprising an assembly tolerance portion according to a further embodiment.

FIG. 6 shows a further embodiment of the package 100, where like elements with like or similar functionality as in the previous Figures are denoted with like reference numerals. According to this embodiment, the MEMS pressure transducer 150 covering the fluid port 140 may be arranged at or on the lid 120, while the package pad 160 may be arranged at or on the substrate 110. Thus, the MEMS pressure transducer 150 and the package pad 160 may be arranged on two opposite sides of the package 100.

According to this embodiment, the rigid transfer block 180 may be configured as one integral part extending without gaps between the lid 120 and the substrate 110, i.e. no physical gap may remain between the transfer block 180 and the substrate 110. Furthermore, the MEMS pressure transducer 150 may be mounted on the lid 120 such that it covers the fluid port 140 provided in the lid 120. The package pad 160 may be provided at the substrate 110 and, thus, may be arranged on an opposite side of the MEMS pressure transducer 150.

In this embodiment, the rigid transfer block 180 may comprise an assembly tolerance portion 170. The assembly tolerance portion 170 may comprise an accommodating portion 175 being provided at the rigid transfer block 180, where the accommodating portion 175 may be accommodated in a hole 128 provided in the lid 120. The accommodating portion 175 may be provided as a protruding portion that protrudes from a surface of the transfer block 180. The accommodating portion 175 may be provided at an upper surface of the transfer block 180 that faces the lid 120. The accommodating portion 175 may be inserted into the hole 128 in the lid 120. The accommodating portion 175 may be flush with the outer surface of the lid 120.

Additionally or alternatively (not shown here), the rigid transfer block 180 may comprise an accommodating portion being provided at a lower surface of the transfer block 180 that faces the substrate 110. This accommodating portion may be accommodated in a hole provided in the substrate 110. The accommodating portion 175 may be inserted into the hole in the substrate 110.

The hole 128 in the lid 120 and/or in the substrate 110 may be wider than a width of the accommodating portion 175, such that the accommodating portion 175 is accommodated inside the hole 128 by a clearance-fit. The accommodating portion 175 of the transfer block 180 may comprise a width that may be about 1.2 times to about 1.8 times smaller than the width of the hole 128. For example, the hole 128 in the lid 120 may comprise a width between 0.7 mm and 0.8 mm, while the accommodating portion 175 may comprise a width be-tween 0.4 mm and 0.6 mm. Accordingly, a clearance between the accommodating portion 175 and the hole 128 in the lid 120 may be between 0.1 mm and 0.4 mm.

A clearance between the accommodating portion 175 and the hole 128 may be filled with bonding material 250, in particular with non-conductive bonding material, such as glue. For example, the non-conductive bonding material 250 may be permanently elastic, such that it is elastic prior to and after curing. For example, the bonding material 250 may comprise a permanently elastic soft glue. Alternatively, the non-conductive bonding material 250 may be temporarily elastic, such that it is elastic prior to curing but non-elastic after curing.

In a pre-assembly step, the accommodating portion 175 bearing the bonding material 250 may be loosely inserted into the hole 128. Accordingly, the rigid transfer block 180 may then be loosely attached to the lid 120. The rigid transfer block 180 can be electrically coupled, e.g. by means of bond wires 121, to the MEMS pressure transducer 150 that may be fixedly secured to the lid 120. During assembly, i.e. after attaching the lid 120 to the substrate 110, the transfer block 180 can be fixedly secured to the lid 120, e.g. by curing the non-conductive bonding material 250. The rigid transfer block 180 may then be electrically coupled, and fixedly secured, to the substrate 110 by means of solder 240 using a thermal reflow process.

Alternatively, the rigid transfer block 180 may be attached to, and fixedly secured, to the substrate 110 in a pre-assembly step, e.g. by means of solder or glue 240. During assembly, the lid 120 can be attached to the substrate 110 such that the hole 128 in the lid 120 is positioned opposite to the accommodating portion 175 of the rigid transfer block 180. When attaching the lid 120 to the substrate 110, the hole 128 in the lid 120 can be put over the accommodating portion 175 bearing the bonding material 250. The clearance-fit between the accommodating portion 175 and the hole 128 can provide a mechanical assembly tolerance, such that the lid 120 can be attached to the substrate 110 with some misalignment.

Figure 7:
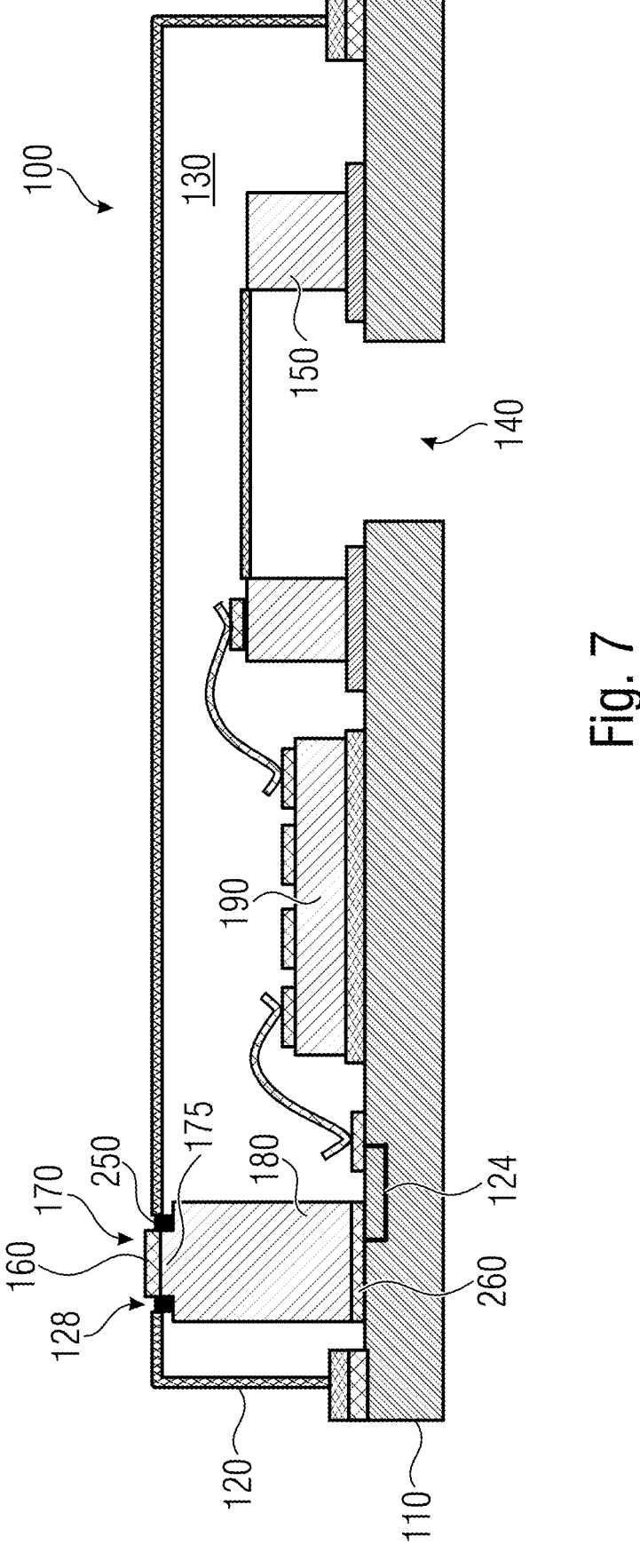
FIG. 7 shows a schematic side view of a pressure transducer package with a rigid transfer block comprising an assembly tolerance portion according to a further embodiment.

FIG. 7 shows a further embodiment of the package 100, where like elements with like or similar functionality as in the previous Figures are denoted with like reference numerals. According to this embodiment, the MEMS pressure transducer 150 covering the fluid port 140 may be arranged at or on the substrate 110, while the package pad 160 may be arranged at or on the rigid transfer block 180, in particular at a surface of the transfer block 180 facing away from the substrate 110. Thus, the MEMS pressure transducer 150 and the package pad 160 may be arranged on two opposite sides of the package 100.

In contrast to previously discussed FIG. 6, the fluid port 140 may be provided in the substrate 110, e.g. formed as a through hole extending between two opposite surfaces of the substrate 110. The MEMS pressure transducer 150 may be mounted on the substrate 110 such that it covers the fluid port 140.

According to the embodiment as shown in FIG. 7, the rigid transfer block 180 may be configured as one integral part extending without gaps between the lid 120 and the substrate 110, i.e. there is no physical gap remaining between the transfer block 180 and the substrate 110.

The assembly tolerance portion 170 may comprise an accommodating portion 175 being provided at the rigid transfer block 180, wherein the accommodating portion 175 may be accommodated in a hole 128 provided in the lid 120. Regarding the rigid transfer block 180, the accommodating portion 175, the hole 128 and the bonding material 250, it is noted that elements previously described with reference to FIG. 6, correspondingly may apply to the embodiment of FIG. 7.

However, in the embodiment of FIG. 7, the package pad 160 may be arranged at the rigid transfer block 180, and in particular at the accommodating portion 175 accommodated inside the hole 128 in the lid 120. The package pad 160 may protrude from the hole 128 in the lid 120 for being externally contactable from outside the package 100.

At the opposite side of the rigid transfer block 180, i.e. the side that faces the substrate 110, the rigid transfer block 180 may be electrically and mechanically coupled to the substrate 110 by means of a bonding means, such as solder or glue. For example, the rigid transfer block 180 may be coupled to a surface pad 260 provided at a surface of the substrate 110. An integrated conducting layer 124 may electrically connect the surface pad 260 with the MEMS pressure transducer 150, wherein the aforementioned integrated circuitry 190 may optionally sit in between.

As mentioned before, conducting surface pads, conducting surface traces and integrated conducting layers may be part of the wiring of the substrate 110. Accordingly, stated in more general terms, the rigid transfer block 180 may be conductively coupled to a wiring being provided in or at the substrate 110 for establishing the electric path between the package pad 160 and the oppositely arranged MEMS pressure transducer 150.

Figure 8:
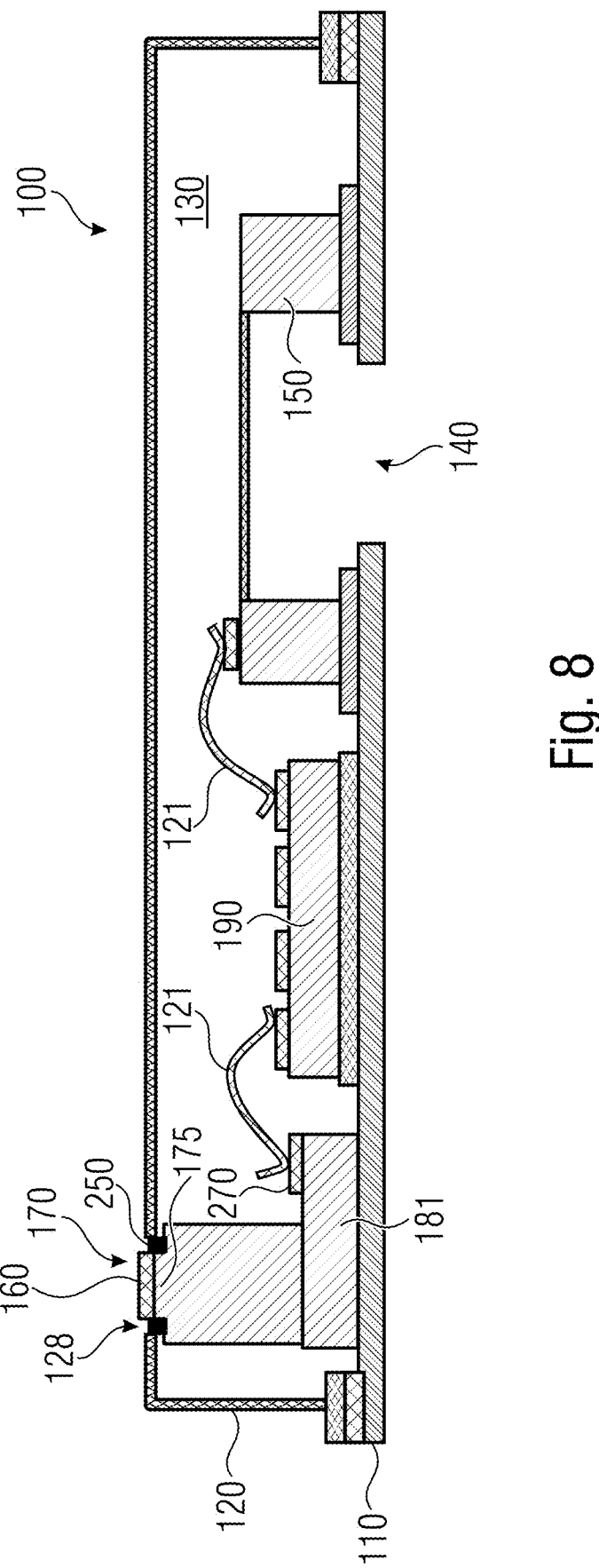
FIG. 8 shows a schematic side view of a pressure transducer package with a rigid transfer block comprising an assembly tolerance portion according to a further embodiment.

FIG. 8 shows a further embodiment of the package 100, where like elements with like or similar functionality as in the previous Figures are denoted with like reference numerals. According to this embodiment, the MEMS pressure transducer 150 covering the fluid port 140 may be arranged at or on the substrate 110, while the package pad 160 may be arranged at or on the rigid transfer block 180, in particular at a surface of the transfer block 180 facing away from the substrate 110. Thus, the MEMS pressure transducer 150 and the package pad 160 may be arranged on two opposite sides of the package 100.

In contrast to previously discussed FIG. 7, the rigid transfer block 180 may comprise a conductive connection pad 270 for establishing the electric path between the package pad 160 and the MEMS pressure transducer 150, where the conductive connection pad 270 may be spatially and galvanically separated from the substrate 110.

For example, the rigid transfer block 180 may comprise a protruding portion 181 at which the conductive connection pad 270 may be arranged. The protruding portion 181 may laterally protrude from the contour of the rigid transfer block 180. The conductive connection pad 270 may be arranged at the protruding portion 181 such that the protruding portion 181 is positioned between the conductive connection pad 270 and the substrate 110.

The electric path between the package pad 160 and the oppositely arranged MEMS pressure transducer 150 may be established by electric connectors 121, such as bond wires, for example. The electric connectors 121 may be connected to the conductive connection pad 270. The conductive connection pad 270 and the package pad 160 may be electrically coupled to each other by means of wirings provided in or at the rigid transfer block 180. Accordingly, by connecting the MEMS pressure transducer 150 to the conductive connection pad 270, the MEMS pressure transducer 150 is also coupled to the package pad 160. Optionally, a controlling circuitry 190 may sit in the electric path between the MEMS pressure transducer 150 and the package pad 160.

According to the embodiment shown in FIG. 8, the substrate 110 may be configured as an unwired substrate, i.e. the substrate 110 may not be equipped with wiring, such as surface pads, surface traces or integrated conductive layers. A plastic substrate may be used in this case.

Figure 9:
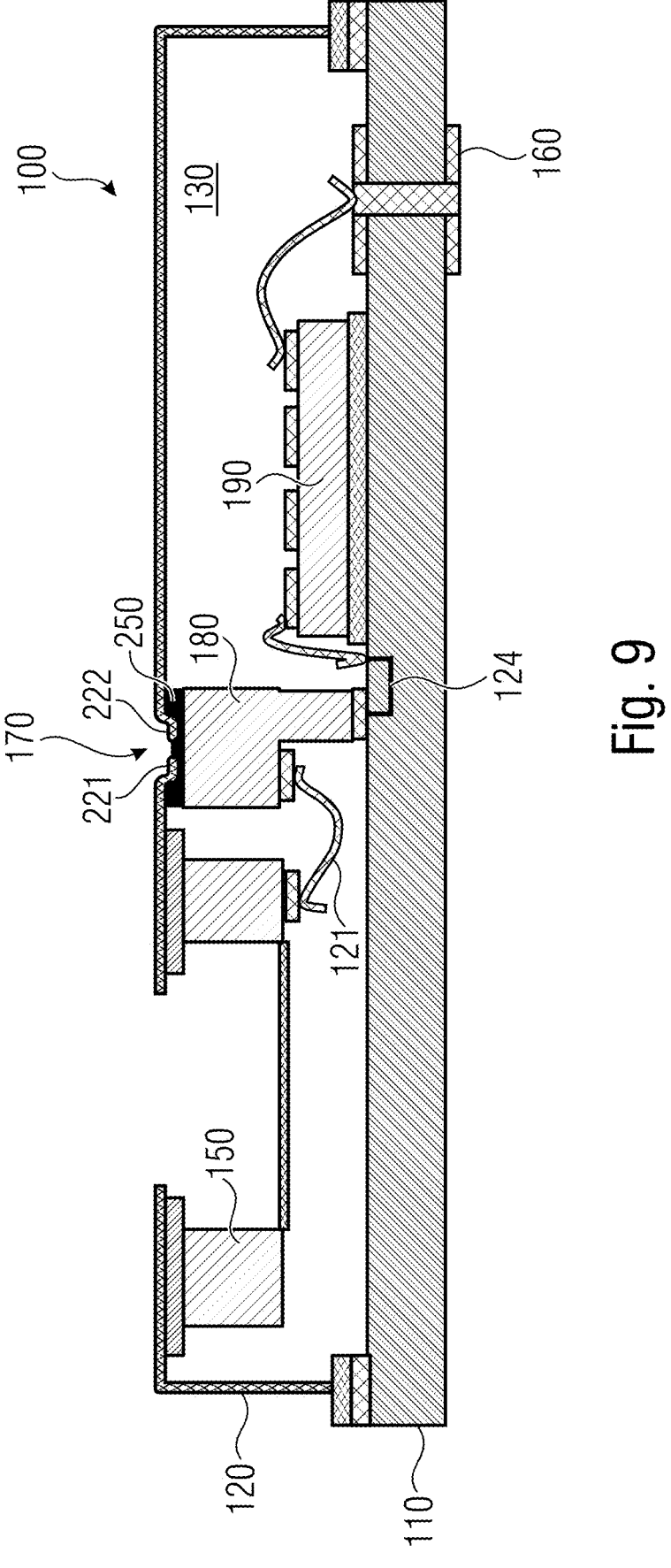
FIG. 9 shows a schematic side view of a pressure transducer package with a rigid transfer block and a lid comprising an assembly tolerance portion according to a further embodiment.

FIG. 9 shows a further embodiment of the package 100, where like elements with like or similar functionality as in the previous Figures are denoted with like reference numerals. According to this embodiment, the MEMS pressure transducer 150 covering the fluid port 140 may be arranged at or on the lid 120, while the package pad 160 may be arranged at or on the substrate 110. Thus, the MEMS pressure transducer 150 and the package pad 160 may be arranged on two opposite sides of the package 100.

The rigid transfer block 180 may be similar to the embodiments discussed with reference to FIG. 6. However the embodiment of FIG. 8 can be combined with each embodiment in which the rigid transfer block 180 is coupled to the lid 120.

As can be seen in FIG. 9, the lid 120 comprises one or more flexible tongues 221, 222. The flexible tongues 221, 222 may be integrally formed with the lid 120. For example, the one or more flexible tongues 221, 222 may be created by providing some cutout portions in the lid 120, and by bending the remaining lid material portions to the inside, i.e. in the direction of the cavity 130.

Due to the flexible nature of the flexible tongues 221, 222, the flexible tongues 221, 222 may provide some mechanical assembly tolerance. Thus, the flexible tongues 221, 222 are one exemplary embodiment of the assembly tolerance portion 170. In the previously discussed embodiments, the assembly tolerance portion 170 was part of the rigid transfer block 180. However, additionally or alternatively, the assembly tolerance portion 170 may comprise the above discussed flexible tongues 221, 222 that may be part of the lid 120.

The resilient or flexible tongues 221, 222 may allow for a compensation of vertical assembly misalignments, i.e. a misalignment in a direction between the lid 120 and the substrate 110. In other words, the resilient or flexible tongues 221, 222 may provide a vertical assembly tolerance.

The one or more flexible tongues 221, 222 may be attached to the rigid transfer block 180, e.g. by means of non-conductive bonding material 250, such as glue. The bonding material 250 may be permanently or temporarily elastic, as discussed above. For example, the bonding material 250 may comprise a permanently elastic soft glue. As long as the bonding material 250 is flexible, it allows for a lateral misalignment, i.e. it provides a lateral assembly tolerance.

In a pre-assembly step, i.e. prior to attaching the lid 120 to the substrate 110, the transfer block 180 may be attached to the flexible tongues 221, 222 by means of the bonding material 250. The transfer block 180 may be loosely attached to the tongues 221, 222. The loose connection may be provided, for instance, if the bonding material 250 is flexible prior to curing. During assembly, i.e. when the lid 120 gets attached to the substrate 110, the flexible tongues 221, 222 in combination with the flexible bonding material 250 may allow for a compensation of lateral and vertical assembly misalignments. After the lid 120 has been attached to the substrate 110, the bonding material 250 may be cured.

Figure 10:
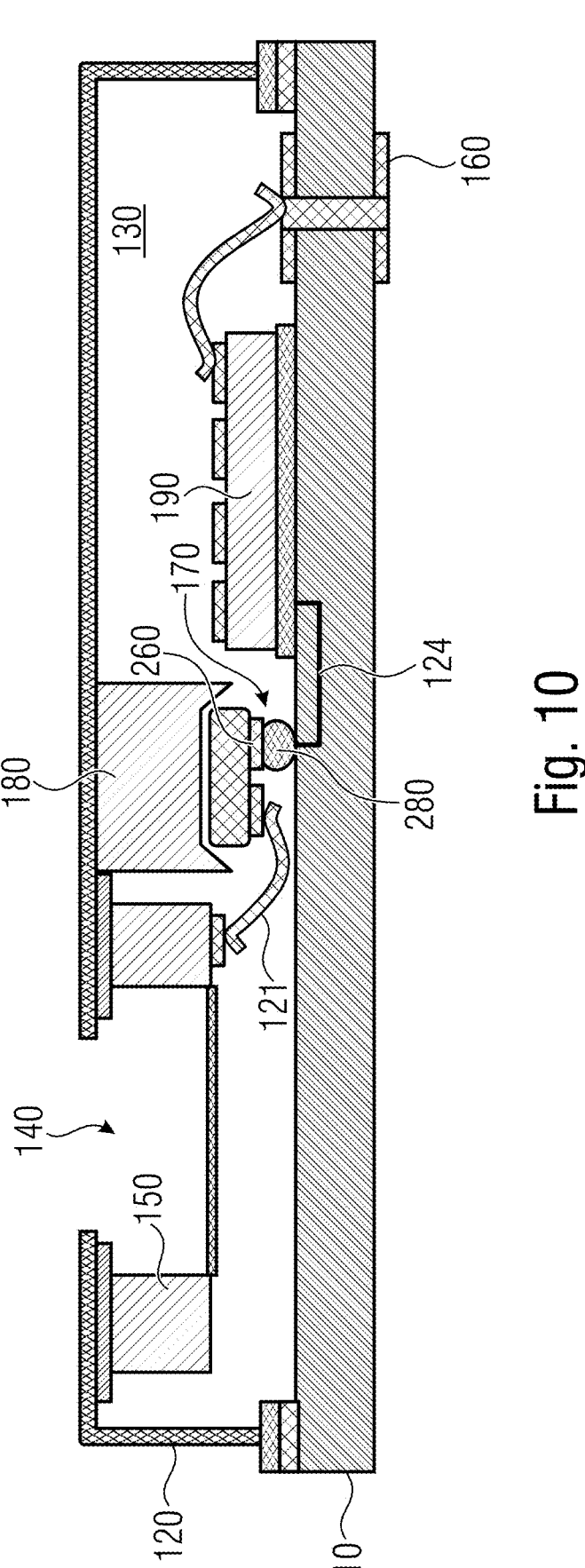
FIG. 10 shows a schematic side view of a pressure transducer package with a rigid transfer block comprising an assembly tolerance portion according to a further embodiment.

FIG. 10 shows a further embodiment of the package 100, where like elements with like or similar functionality as in the previous Figures are denoted with like reference numerals. According to this embodiment, the MEMS pressure transducer 150 covering the fluid port 140 may be arranged at or on the lid 120, while the package pad 160 may be arranged at or on the substrate 110. Thus, the MEMS pressure transducer 150 and the package pad 160 are arranged on two opposite sides of the package 100.

According to this embodiment, the assembly tolerance portion 170 may comprise a solder connector 280, such as a stud bump or a solder ball. During assembly, i.e. while attaching the lid 120 to the substrate 110, the package 100 can undergo a thermal reflow process such that the solder connector 280 is heated to its reflow temperature at which it begins to slightly flow. At this stage, the viscous solder connector 280 may allow for a movement of the transfer block 180 thereby providing a certain assembly tolerance.

The transfer block 180 may comprise a conductive connection pad 260 for conductively coupling to the solder connector 280. The solder connector 280 may be conductively coupled with the substrate 110 by means of the wiring of the substrate 110, e.g. by means of a conductive surface pad, or the like.

In a pre-assembly step, the MEMS pressure transducer 150 and the transfer block 180 may be arranged at the inside of the lid 120, such as directly adjacent to each other. The MEMS pressure transducer 150 may be electrically coupled with the transfer block 180 via a flexible connector, such as a bond wire 121. Accordingly, the lid 120 comprising the MEMS pressure transducer 150 and the rigid transfer block 180 can be pre-assembled before the lid 120 is attached to the substrate 110.

Figure 11:
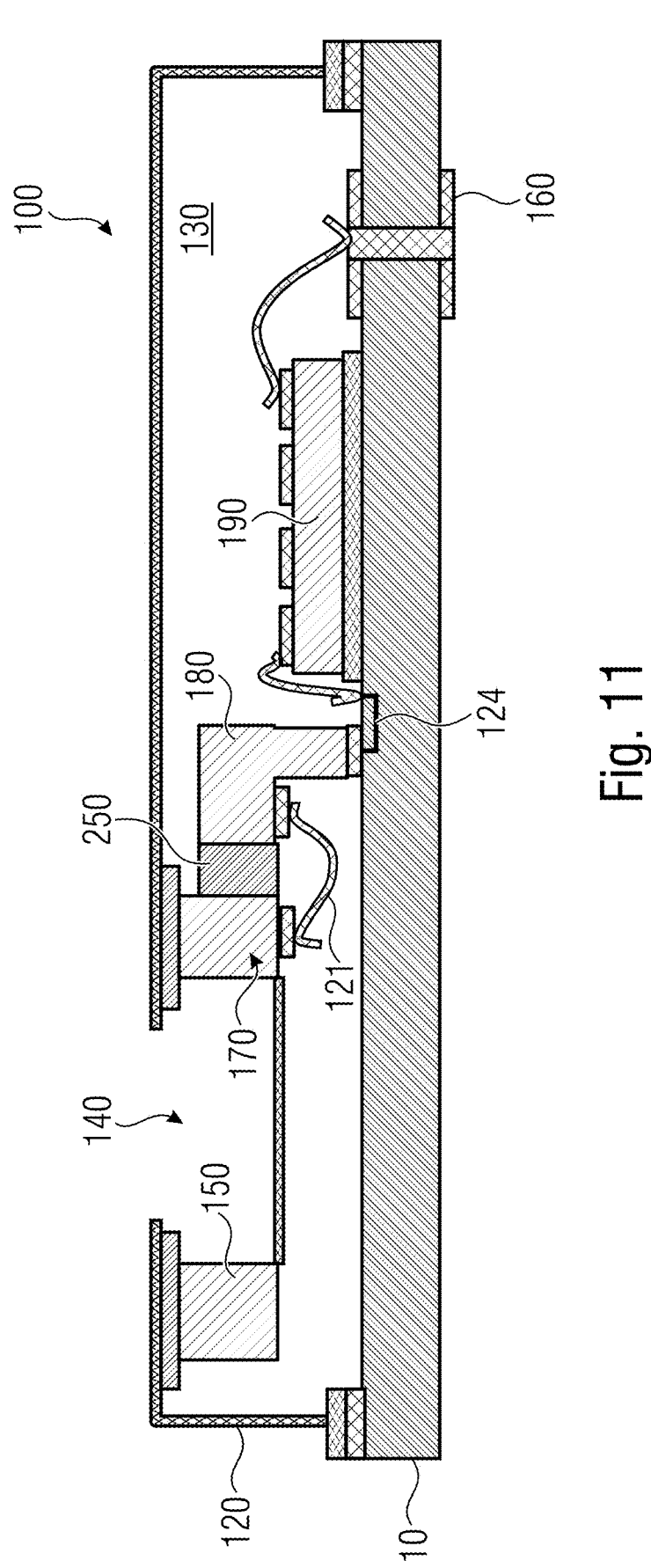
FIG. 11 shows a schematic side view of a pressure transducer package with a rigid transfer block comprising an assembly tolerance portion according to a further embodiment.

FIG. 11 shows a further embodiment of the package 100, where like elements with like or similar functionality as in the previous Figures are denoted with like reference numerals. According to this embodiment, the MEMS pressure transducer 150 covering the fluid port 140 may be arranged at or on the lid 120, while the package pad 160 may be arranged at or on the substrate 110. Thus, the MEMS pressure transducer 150 and the package pad 160 may be arranged on two opposite sides of the package 100.

In this embodiment, the rigid transfer block 180 may be attached to the substrate 110 and indirectly attached to the lid 120 via the MEMS pressure transducer 150, wherein the assembly tolerance portion 170 may be provided between the rigid transfer block 180 and the MEMS pressure transducer 150.

The assembly tolerance portion 170 may comprise a bonding material 250, and in particular a non-conductive bonding material, such as glue. The bonding material 250 may be permanently elastic, such that it is elastic prior to and after curing. For example, the bonding material 250 may comprise a permanently elastic soft glue. Alternatively, the non-conductive bonding material 250 may be temporarily elastic, such that it is elastic prior to curing but non-elastic after curing.

In a further embodiment, that is not explicitly depicted here, the MEMS pressure transducer 150 may be attached to the substrate 110. The rigid transfer block 180 may be attached to the lid 120 and indirectly attached to the substrate 110 via the MEMS pressure transducer 150. In this case, the assembly tolerance portion 170 may be provided between the rigid transfer block 180 and the MEMS pressure transducer 150.

Mounting the rigid transfer block 180 to the lid 120 via the MEMS pressure transducer 150 by means of a soft/flexible bonding material 250 may lower the mechanical stress. The bonding material 250 may provide a fixation between the transfer block 180 and the MEMS pressure transducer 150, which can be stable enough to allow for an electric coupling of the MEMS pressure transducer 150 and the transfer block 180 by flexible bonding means during a pre-assembly step.

In the embodiments described herein, the assembly tolerance portion 170 may provide a mechanical assembly tolerance during assembly of the package 100. This may address the overdefinition problem, i.e. overdefinition of a statically indeterminate system can be avoided. Instead, the assembly tolerance portion may provide an underdefined statically indeterminate system.

In the herein discussed opposite-port-pad configuration, the rigid transfer block 180 is attached to one of the substrate 110 and the lid 120, while the rigid transfer block 180 is (flexibly) attached to one of the substrate 110 and the lid 120 via the assembly tolerance portion 170. In other words, the rigid transfer block 180 may be coupled to one of the lid 120 and the substrate 110 by means of the assembly tolerance portion 170, even if the rigid transfer block 180 is fixedly secured to the other one of the lid 120 and the substrate 110.

In some embodiments, the assembly tolerance portion 170 may provide a clearance-fit between the rigid transform block 180 and one of the substrate 110 and the lid 120. Any clearance between the rigid transform block 180 and the one of the substrate 110 and the lid 120 may be filled with a conductive or non-conductive bonding material 250, such as solder or glue.

The bonding material 250 may be permanently elastic, such that it is elastic prior to and after curing. For example, the bonding material 250 may comprise a permanently elastic soft glue. Alternatively, the non-conductive bonding material 250 may be temporarily elastic, such that it is elastic prior to curing but non-elastic after curing.

According to some embodiments, the assembly tolerance portion 170 may comprise a permanently elastic bonding material 250 being applied to the rigid transfer block 180 for permanently elastically attaching the rigid transfer block 180 to at least one of the lid 120 and the substrate 110.

Figure 12:
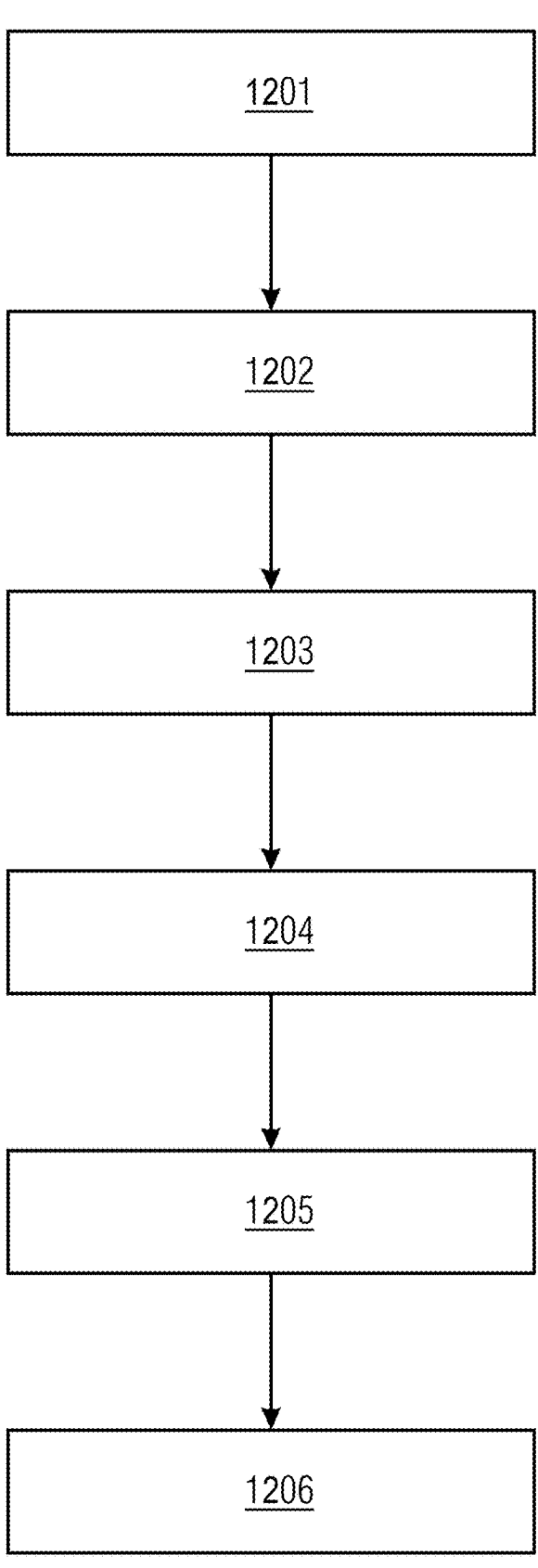
FIG. 12 shows a schematic block diagram of a method for manufacturing a pressure transducer package according to an embodiment

A corresponding method is for manufacturing a pressure transducer package 100 as described above. A schematic block diagram of a method according to an embodiment is depicted in FIG. 12.

As schematically illustrated by block 1201 the method may include a step of providing a substrate 110 and a lid 120, where one of the substrate 110 and the lid 120 include a fluid port 140, and where the other one of the substrate 110 and the lid 120 include a conductive package pad 160.

As schematically illustrated by block 1202 the method may further include a step of mounting a MEMS pressure transducer 150 such that it covers the fluid port 140.

As schematically illustrated by block 1203 the method may further include a step of providing a rigid transfer block 180, the rigid transfer block 180 being configured to provide an electric path between the MEMS pressure transducer 150 and the package pad 160.

As schematically illustrated by block 1204 the method may further include a step of performing a pre-assembly step in which the MEMS pressure transducer 150 is electrically coupled to the rigid transfer block 180.

After the pre-assembly step, as schematically illustrated by block 1205, the method may further include a step of closing the package 100 by attaching the lid 120 to the substrate 110 such that the package pad 160 is provided at a first side 101 of the package 100, while the fluid port 140 is provided at a second side 102 opposite the first side 101 of the package 100.

As schematically illustrated by block 1206 the method may further include a step of providing an assembly tolerance portion 170 associated with at least one of the lid 120 and the rigid transfer block 180 for providing a mechanical assembly tolerance between the rigid transfer block 180 and at least one of the substrate 110 and the lid 120 during the step of attaching the lid 120 to the substrate 110. The assembly tolerance portion 170 may be provided prior to attaching the lid 120 to the substrate 110.

In particular embodiments, a pressure transducer package comprising a substrate and a lid is attached to the substrate, where a cavity is defined underneath the lid. A MEMS pressure transducer is arranged inside the cavity, the MEMS pressure transducer covering a fluid port. A package pad is provided at a first side of the package, while the fluid port is provided at an opposite second side of the package. A transfer block is configured to provide an electric path between the MEMS pressure transducer and the oppositely arranged package pad, where at least one of the lid and the rigid transfer block comprises an assembly tolerance portion for providing a mechanical assembly tolerance between the rigid transfer block and at least one of the substrate and the lid.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

While this disclosure has been described with reference to illustrative embodiments, this description is not intended to be construed in a limiting sense. Various modifications and combinations of the illustrative embodiments, as well as other embodiments of this disclosure, will be apparent to persons skilled in the art upon reference to the description. It is therefore intended that the appended claims encompass any such modifications or embodiments.

What is claimed is:

1. A pressure transducer package comprising:
a substrate and a lid attached to the substrate, including a cavity defined underneath the lid;
a MEMS pressure transducer arranged inside the cavity;
a fluid port configured for allowing a fluid exchange between an interior and an exterior of the cavity, the MEMS pressure transducer covering the fluid port;
a package pad configured for electrically contacting the MEMS pressure transducer from outside the pressure transducer package, wherein the package pad is provided at a first side of the pressure transducer package and the fluid port is provided at a second side of the pressure transducer package opposite the first side; and
a transfer block arranged inside the cavity, the transfer block being rigid and configured to provide an electric path between the MEMS pressure transducer and the package pad,
wherein at least one of the lid or the transfer block comprises an assembly tolerance portion configured for accommodating a mechanical assembly tolerance between the transfer block and at least one of the substrate or the lid.

2. The pressure transducer package according to claim 1,
wherein the transfer block is mounted between the lid and the substrate, and
wherein the assembly tolerance portion is configured to allow for a relative displacement between the substrate and the lid while keeping the transfer block at a mounting position during assembly of the pressure transducer package.

3. The pressure transducer package according to claim 1,
wherein the transfer block is mounted between the lid and the substrate, and
wherein the assembly tolerance portion is configured as a static mechanical system, in which the lid, the transfer block and the substrate are mechanically connected with each other and are statically indeterminate.

4. The pressure transducer package according to claim 1,
wherein the transfer block is attached to one of the substrate or the lid via the assembly tolerance portion,
wherein the transfer block is directly attached to the other one of the substrate or the lid, and
wherein the assembly tolerance portion provides a first clearance-fit between the transfer block and one of the substrate or the lid.

5. The pressure transducer package according to claim 1, further comprising:
a bonding material applied to the transfer block for elastically attaching the transfer block to at least one of the lid or the substrate, the bonding material included with the assembly tolerance portion.

6. The pressure transducer package according to claim 1,
wherein the transfer block is attached to the lid and spaced apart from the substrate, wherein a gap remains between the transfer block and the substrate, and
wherein the assembly tolerance portion comprises a conductive pin bridging the gap and providing a conductive path between the transfer block and the substrate.

7. The pressure transducer package according to claim 6, further comprising:
a bent portion in the conductive pin for increasing flexibility of the conductive pin.

8. The pressure transducer package according to claim 6, further comprising:
a first recess in the transfer block, wherein the conductive pin is, at least partly, arranged inside the first recess,
wherein the first recess is wider than a width of the conductive pin, such that the conductive pin is accommodated inside the first recess by a second clearance-fit, and
wherein a clearance between the conductive pin and the first recess is filled with a conductive filler material.

9. The pressure transducer package according to claim 6, further comprising:

a second recess provided in the substrate, wherein the conductive pin is, at least partly, arranged inside the second recess, wherein the second recess is wider than a width of the conductive pin, such that the conductive pin is accommodated inside the second recess by a third clearance-fit, and wherein a clearance between the conductive pin and the second recess is filled with a conductive filler material.

10. The pressure transducer package according to claim 8, wherein the conductive filler material comprises at least one of solder, a solder paste or a conductive adhesive.

11. The pressure transducer package according to claim 6, wherein the conductive pin comprises an electric insulation structure provided around an outer circumference of the conductive pin.

12. The pressure transducer package according to claim 1, wherein the transfer block extends without a gap between the lid and the substrate, wherein the assembly tolerance portion comprises an accommodating portion being provided at the transfer block, wherein the accommodating portion is accommodated in a hole provided in the lid, wherein the hole in the lid is wider than a width of the accommodating portion, such that the accommodating portion is accommodated inside the hole by a fourth clearance-fit, and wherein a clearance between the accommodating portion and the hole is filled with bonding material.

13. The pressure transducer package according to claim 12, wherein the package pad is arranged at the accommodating portion of the transfer block, wherein the package pad protrudes from the hole in the lid and forms an external contact outside the pressure transducer package.

14. The pressure transducer package according to claim 1, wherein the transfer block is conductively coupled to a wiring at the substrate for establishing the electric path between the package pad and the MEMS pressure transducer.

15. The pressure transducer package according to claim 1, wherein the transfer block comprises a conductive connection pad for establishing the electric path between the package pad and the MEMS pressure transducer, and wherein the conductive connection pad is spatially and galvanically separated from the substrate.

16. The pressure transducer package according to claim 1, wherein the assembly tolerance portion comprises one or more flexible tongues integral with the lid, and wherein the one or more flexible tongues are attached to the transfer block.

17. The pressure transducer package according to claim 1, wherein the MEMS pressure transducer is attached to the lid, wherein the transfer block is arranged between the substrate and the MEMS pressure transducer, wherein the transfer block is attached to the substrate, and wherein the assembly tolerance portion is provided between the transfer block and the MEMS pressure transducer.

18. The pressure transducer package according to claim 1, wherein the MEMS pressure transducer is attached to the substrate, wherein the transfer block is arranged between the lid and the MEMS pressure transducer, wherein the transfer block is attached to the lid, and wherein the assembly tolerance portion is provided between the transfer block and the MEMS pressure transducer.

19. A pressure transducer device comprising:

a substrate and a lid attached to the substrate, including a cavity defined underneath the lid;

a MEMS pressure transducer arranged inside the cavity;

a fluid port configured for allowing a fluid exchange between an interior and an exterior of the cavity, the MEMS pressure transducer covering the fluid port;

a package pad configured for electrically contacting the MEMS pressure transducer from outside a package of the pressure transducer device, wherein the package pad is provided at a first side of the package and the fluid port is provided at a second side of the package opposite the first side; and a transfer block arranged inside the cavity, the transfer block being rigid and configured to provide an electric path between the MEMS pressure transducer and the package pad, wherein at least one of the lid or the transfer block comprises an assembly tolerance portion configured for accommodating a mechanical assembly tolerance between the transfer block and at least one of the substrate or the lid, and wherein the MEMS pressure transducer is attached to at least one of the substrate or the lid.

20. A method for providing a pressure transducer device, the method comprising:

providing a substrate and a lid attached to the substrate, including a cavity defined underneath the lid;

providing a MEMS pressure transducer arranged inside the cavity;

providing a fluid port for allowing a fluid exchange between an interior and an exterior of the cavity, the MEMS pressure transducer covering the fluid port;

providing a package pad for electrically contacting the MEMS pressure transducer from outside a package of the pressure transducer device, wherein the package pad is provided at a first side of the package and the fluid port is provided at a second side of the package opposite the first side;

providing a transfer block arranged inside the cavity, the transfer block being rigid and configured to provide an electric path between the MEMS pressure transducer and the package pad; and providing an assembly tolerance portion for accommodating a mechanical assembly tolerance between the transfer block and at least one of the substrate or the lid, wherein at least one of the lid or the transfer block comprises the assembly tolerance portion.

* * * * *